(12) United States Patent
Rueger

(10) Patent No.: US 8,643,419 B2
(45) Date of Patent: Feb. 4, 2014

(54) FLEXIBLE LOW POWER SLEW-RATE CONTROLLED OUTPUT BUFFER

(75) Inventor: Timothy T. Rueger, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 0 days.

(21) Appl. No.: 13/289,068

(22) Filed: Nov. 4, 2011

(65) Prior Publication Data

US 2013/0113524 A1    May 9, 2013

(51) Int. Cl.
  *H03K 5/12*    (2006.01)

(52) U.S. Cl.
  USPC ............ 327/170; 327/380; 327/381; 327/112

(58) Field of Classification Search
  USPC ......... 327/112, 170, 179, 180, 309, 310, 380, 327/381
  See application file for complete search history.

(56) References Cited

U.S. PATENT DOCUMENTS

| | | | |
|---|---|---|---|
| 4,857,863 A | 8/1989 | Ganger et al. | |
| 5,218,239 A * | 6/1993 | Boomer | 326/27 |
| 5,859,541 A | 1/1999 | McMahan et al. | |
| 6,262,617 B1 * | 7/2001 | McClure | 327/270 |
| 6,483,354 B1 * | 11/2002 | Gasparik | 327/112 |
| 6,894,547 B2 * | 5/2005 | Takahashi | 327/170 |
| 7,224,179 B2 * | 5/2007 | Kim | 326/26 |
| 7,236,012 B2 * | 6/2007 | Cho et al. | 326/83 |
| 7,554,385 B2 * | 6/2009 | Ishida | 327/536 |
| 7,839,200 B2 * | 11/2010 | Im et al. | 327/512 |
| 7,919,988 B2 * | 4/2011 | Oh | 326/87 |
| 2003/0189446 A1 * | 10/2003 | Yoo et al. | 327/108 |
| 2007/0024328 A1 * | 2/2007 | Shin | 327/112 |
| 2007/0057705 A1 * | 3/2007 | Kanzaki | 327/112 |
| 2008/0106297 A1 * | 5/2008 | Jao | 326/27 |

OTHER PUBLICATIONS

Silicon Laboratories Inc.; "Ultra Low Power, 16/8 kB, 12/10-Bit ADC MCU with Integrated 240-960 MHz EZRadioPRO Transceiver"; Product Specification; May 2011; pp. 218-238; Si1010/1/2/3/4/5, Rev. 1.1 5/11; Silicon Laboratories Inc., 400 West Cesar Chavez, Austin, TX 78701.

* cited by examiner

*Primary Examiner* — Lincoln Donovan
*Assistant Examiner* — Jung H Kim
(74) *Attorney, Agent, or Firm* — Polansky & Associates, P.L.L.C.; Paul J. Polansky

(57) ABSTRACT

An output buffer includes a pullup driver, a pulldown driver, and an output stage. The pullup driver has a drive control input, and an output for providing a pullup drive signal in a push-pull mode in response to receiving a first drive control signal on the drive control input, and in a current limited mode in response to receiving a second drive control signal on said drive control input. The pulldown driver has a drive control input, and an output for providing a pulldown drive signal in the push-pull mode in response to receiving a third drive control signal on the drive control input, and in the current limited mode in response to receiving a fourth drive control signal on the drive control input. The output stage provides a voltage on an output terminal in response to the pullup and pulldown drive signals.

20 Claims, 5 Drawing Sheets

US 8,643,419 B2

FLEXIBLE LOW POWER SLEW-RATE CONTROLLED OUTPUT BUFFER

FIELD OF THE DISCLOSURE

The present disclosure relates generally to output buffers, and more particularly, to output buffers with slew rate control.

BACKGROUND

Integrated circuits use output buffers to transform relatively weak internal signals into stronger signals suitable for external use, such as for transmission to other integrated circuits on printed circuit boards. However the layout and termination of signal lines on printed circuit boards vary widely from application to application. For example integrated circuits on printed circuit boards with short, lightly loaded signal lines do not need output buffers as strong as printed circuit boards with longer, heavily loaded signal lines. If the output buffers are too strong, they may overdrive lightly loaded output signal lines and cause signal failure due to underdamping or ringing on the signal lines. If the output buffers are too weak, they may not be able to drive heavily loaded output signal lines in sufficient time and also cause signal failure.

SUMMARY

In an exemplary embodiment, an output buffer comprises a pullup driver, a pulldown driver, and an output stage. The pullup driver has a drive control input, and an output for providing a pullup drive signal in a push-pull mode in response to receiving a first drive control signal on the drive control input, and in a current limited mode in response to receiving a second drive control signal on the drive control input. The pulldown driver has a drive control input, and an output for providing a pulldown drive signal in the push-pull mode in response to receiving a third drive control signal on the drive control input, and in the current limited mode in response to receiving a fourth drive control signal on the drive control input. The output stage provides a voltage on an output terminal in response to the pullup and pulldown drive signals.

In another exemplary embodiment, an output buffer comprises a decoder, a pullup driver, a pulldown driver, and an output stage. The decoder has a first input for receiving a data signal, a second input for receiving a mode signal, a first output for providing first and second drive control signals, and a second output for providing third and fourth drive control signals. The decoder provides selected ones of the first and third drive control signals in response to respective first and second states of the data signal when the mode signal is in a first state, and provides selected ones of the second and fourth drive control signals in response to the respective first and second states of the data signal when the mode signal is in a second state. The pullup driver has an input coupled to the first output of the decoder, and an output for providing a pullup drive signal in a push-pull mode in response to the first drive control signal and in a current limited mode in response to the second drive control signal. The pulldown driver has an input coupled to the second output of the decoder, and an output for providing a pulldown drive signal in the push-pull mode in response to the third drive signal and in the current limited mode in response to the fourth drive signal. The output stage provides a voltage on an output terminal in response to the pullup and pulldown drive signals.

In yet another exemplary embodiment, a method of providing an output signal on an output terminal includes activating a pullup drive signal to cause a pullup transistor to drive the output signal with a first slew rate indicated by a first slew rate control signal in a push-pull mode in response to a first drive control signal; activating the pullup drive signal to cause the pullup transistor to drive the output signal with substantially the first slew rate in a current limited mode in response to a second drive control signal; activating a pulldown drive signal to cause a pulldown transistor to drive the output signal with a second slew rate indicated by a second slew rate control signal in the push-pull mode in response to a third drive control signal; activating the pulldown drive signal to cause the pulldown transistor to drive the output signal with substantially the second slew rate in the current limited mode in response to a fourth drive control signal; and driving the output signal on the output terminal using the pullup and pulldown transistors selectively in response to the pullup and pulldown drive signals.

BRIEF DESCRIPTION OF THE DRAWINGS

The present disclosure may be better understood, and its numerous features and advantages made apparent to those skilled in the art by referencing the accompanying drawings, in which.

In the following description, the use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

Figure 1:
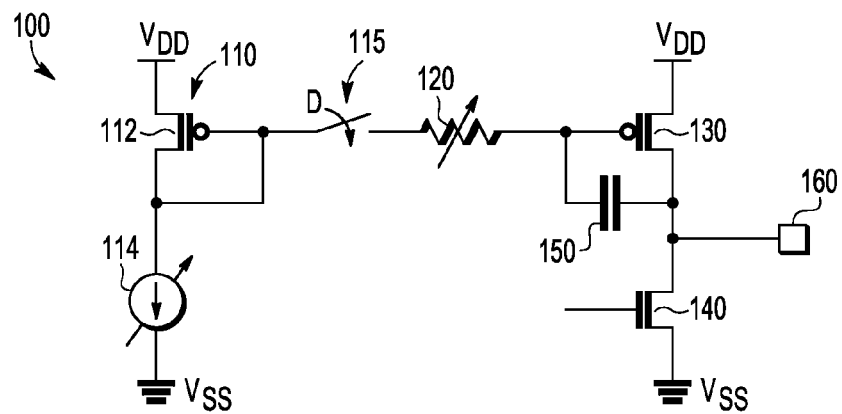
FIG. 1 illustrates in schematic form a conventional output buffer.

FIG. 1 illustrates in schematic form a conventional output buffer 100. Output buffer 100 is connected to a bonding pad 160 and includes a current mirror input branch 110, a switch 115, a variable resistor 120, a P-channel MOS transistor 130, an N-channel MOS transistor 140, and a capacitor 150. Current mirror input branch 110 includes a P-channel transistor 112 and a variable current source 114. Transistor 112 has a source connected to a power supply voltage terminal labeled "$V_{DD}$", a gate, and a drain connected to the gate thereof and forming the output terminal of current mirror input branch 110. $V_{DD}$ is a more positive power supply voltage terminal having a nominal value of, for example, 3.0 volts. Current source 114 has a first terminal connected to the drain of transistor 112, a second terminal connected to a power supply voltage terminal labeled "$V_{SS}$", and a control terminal. $V_{SS}$ is a more negative power supply voltage terminal such as ground having a nominal value of, for example, 0.0 volts. Switch 115 has a first terminal connected to the output terminal of current mirror input branch 110, a second terminal, and a control terminal for receiving a data signal labeled "D". Variable resistor 120 has a first terminal connected to the second terminal of switch 115, a second terminal, and a control terminal. Transistor 130 has a source connected to $V_{DD}$, a gate connected to the second terminal of variable resistor 120, and a drain connected to bonding pad 160. Transistor 140 has a drain connected to the drain of transistor 130 and to bonding pad 160, a gate, and a source connected to $V_{SS}$. Capacitor 150 has a first terminal connected to the second terminal of variable resistor 120, and a second terminal connected to the drain of transistor 130.

In operation, output buffer 100 controls transistor 130 to provide slew rate control for low-to-high transitions on bonding pad 160. During a low-to-high transition, the gate of transistor 130 first discharges to a threshold voltage ($V_{TP}$) below $V_{DD}$ to make transistor 130 conductive. This discharge can happen gradually after data signal D closes switch 115, but due to the large gate capacitance of transistor 130, a precharging circuit (not shown in FIG. 1) can be used to perform this voltage reduction quickly. Once transistor 130 is conductive, output buffer 100 enters a high-gain or slewing period in which the gate-to-source voltage of transistor 130 ($V_{GS130}$) remains at $V_{TP}$ substantially independent of its drain-to-source voltage. During the slewing period, the slew rate at bonding pad 160 is set to $I_{SR}/C$, in which $I_{SR}$ is the current through resistor 120 and is equal to $(V_{GS112}-V_{TP})/R_{120}$, and in which $V_{GS112}$ is the gate-to-source voltage of transistor 112, and $R_{120}$ is the resistance of resistor 120. When bonding pad 160 has transitioned all the way up to $V_{DD}$, output buffer 100 enters a low-gain period during which $V_{GS130}$ discharges substantially to $V_{GS112}$.

Output buffer 100 also includes corresponding, mirror image circuitry connected to the gate of N-channel transistor 140 that is not shown in FIG. 1. This mirror image circuitry becomes operative in response to the complement of data signal D and controls the slew rate of output buffer 100 when driving a low voltage on bonding pad 160 in a manner similar to that discussed above.

Output buffer 100 provides programmable slew rate control for applications that drive heavy loads, such as class D amplifiers that drive audio loudspeakers.

Figure 2:
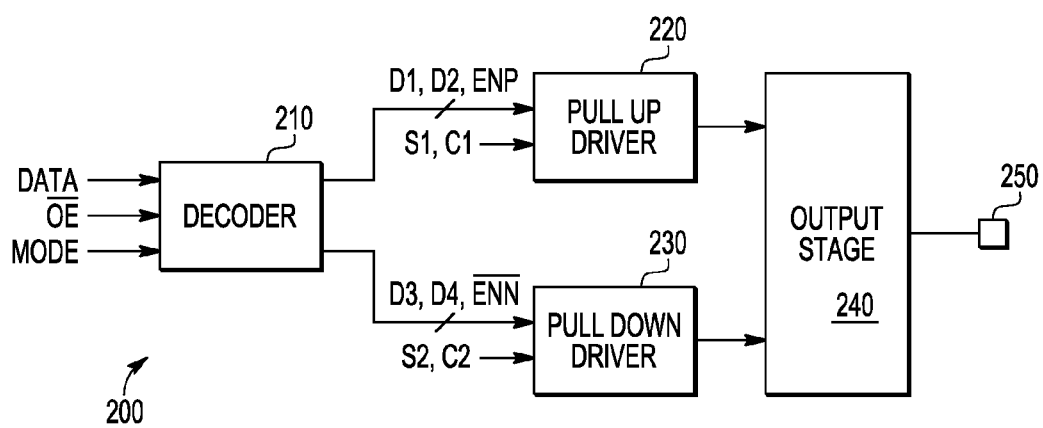
FIG. 2 illustrates in block diagram form an output buffer according to an exemplary embodiment.

FIG. 2 illustrates in block diagram form an output buffer 200 according to an exemplary embodiment. Output buffer 200 is connected to a bonding pad 250 that functions as an output terminal and includes generally a decoder 210, a pullup driver 220, a pulldown driver 230, and an output stage 240. Decoder 210 has a first input for receiving a data signal labeled "DATA", a second input for receiving an active-low output enable signal labeled "$\overline{OE}$", a third input for receiving a mode control signal labeled "MODE", a first output for providing drive control signals labeled "D1" and "D2" and a control signal labeled "ENP", and a second output for providing drive control signals labeled "D3" and "D4" and a control signal labeled "$\overline{ENN}$". Pullup driver 220 has a first input for receiving drive control signals D1 and D2 and control signal ENP, a second input for receiving control signals labeled "S1" and "C1", and an output. Pulldown driver 230 has a first input for receiving drive control signals D3 and D4 and control signal $\overline{ENN}$, a second input for receiving control signals labeled "S2" and "C2", and an output. Output stage 240 has first and second inputs connected to the outputs of pullup driver 220 and pulldown driver 230, respectively, and an output connected to bonding pad 250.

In operation, decoder 210 is responsive to the DATA signal, the $\overline{OE}$ signal, and the MODE signal to provide drive control signals D1-D4 in appropriate logic states. When signal $\overline{OE}$ is inactive at a logic high, decoder 210 provides all of drive control signals D1-D4 and control signals ENP and $\overline{ENN}$ in inactive logic states. When signal $\overline{OE}$ is active at a logic low, decoder 210 provides drive control signals D1-D4 at logic states determined by both the logic state of the DATA signal and the selected MODE. When DATA is high, decoder 210 either activates drive control signal D1 while keeping D2-D4 inactive if MODE is low, or activates drive control signal D2 while keeping D1, D3, and D4 inactive if MODE is high. When DATA is low, decoder 210 either activates drive control signal D3 while keeping D1, D2, and D4 inactive if MODE is low, or activates drive control signal D4 while keeping D1-D3 inactive if MODE is high. TABLE I summarizes the logic states of drive control signals D1-D4 for all possible values of DATA, $\overline{OE}$, and MODE, in which "x" represents a "don't care":

TABLE I

| $\overline{OE}$ | DATA | MODE | D1 | D2 | D3 | D4 |
|---|---|---|---|---|---|---|
| 1 | x | x | 0 | 0 | 0 | 0 |
| 0 | 1 | 0 | 1 | 0 | 0 | 0 |
| 0 | 1 | 1 | 0 | 1 | 0 | 0 |
| 0 | 0 | 0 | 0 | 0 | 1 | 0 |
| 0 | 0 | 1 | 0 | 0 | 0 | 1 |

As will be described further below, the MODE signal allows output buffer 200 to operate in a push-pull mode when MODE=0, or in a current limited mode when MODE=1. Thus output buffer 200 provides more flexibility than known output buffers. For example, output buffer 200 is suitable for use as a slew rate limited output buffer in a general purpose input/output (GPIO) port of a microcontroller to allow it to support a wider range of applications than do known microcontrollers.

Figure 3:
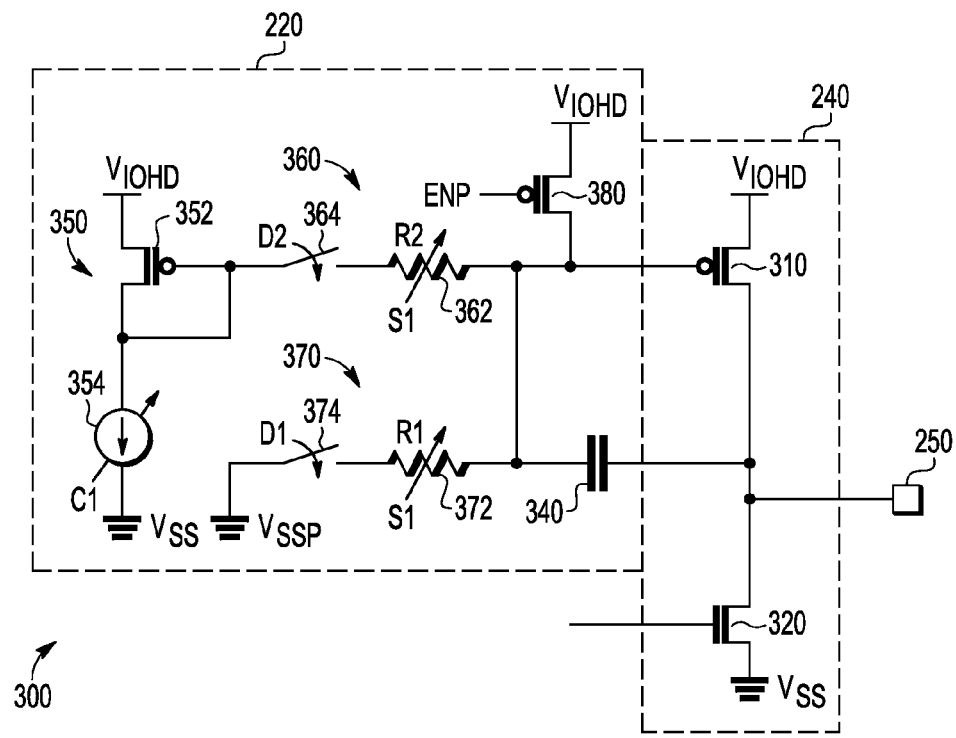
FIG. 3 illustrates in schematic form a portion of an output forming an exemplary embodiment of the output buffer of FIG. 2.

FIG. 3 illustrates in schematic form a portion of an output buffer 300 forming an exemplary embodiment of output buffer 200 of FIG. 2. Output buffer 300 includes an implementation of pullup driver 220 and output stage 240, which are identified by dashed boxes so labeled, in addition to bonding pad 250. Circuitry corresponding to decoder 210 and pulldown driver 230 is not shown but an exemplary embodiment of this circuitry will be illustrated in FIG. 4 below.

Output stage 240 includes a P-channel transistor 310 and an N-channel transistor 320. Transistor 310 has a source connected to a power supply voltage terminal labeled "$V_{IOHD}$", a gate, and a drain connected to bonding pad 250. Transistor 320 has a drain connected to the drain of transistor 310 and to bonding pad 250, a gate, and a source connected to $V_{SS}$.

Pullup driver 220 includes a capacitor 340, a current mirror input branch 350, a switchable resistor 360, a switchable resistor 370, and a P-channel transistor 380. Capacitor 340 has a first terminal, and a second terminal connected to the drain of transistor 310. Current mirror input branch 350 includes a P-channel transistor 352 and a variable current source 354. Transistor 352 has a source connected to $V_{IOHD}$, a gate, and a drain connected to the gate thereof. Current source 354 has a first terminal connected to the drain of transistor 352, a second terminal connected to $V_{SS}$, and a control terminal for receiving control signal C1.

Switchable resistor 360 includes a variable resistor 362 and a switch 364. Variable resistor 362 has a first terminal, a second terminal connected to the gate of transistor 310 and the first terminal of capacitor 340, and a control terminal for receiving control signal S1, and has an associated resistance labeled "R2". Switch 364 has a first terminal connected to the drain and gate of transistor 352, a second terminal connected to the first terminal of resistor 362, and is closed in response to an activation of signal D2.

Switchable resistor 370 includes a variable resistor 372 and a switch 374. Variable resistor 372 has a first terminal connected to the gate of transistor 310 and the first terminal of capacitor 340, a second terminal, and a control terminal for receiving control signal S1, and has an associated resistance labeled "R1". Switch 374 has a first terminal connected to the second terminal of resistor 372, a second terminal connected to a power supply voltage terminal labeled "$V_{SSP}$", and is closed in response to an activation of drive control signal D1.

Note that switches 364 and 374 are preferably implemented with full complementary metal oxide semiconductor (CMOS) transmission gates. Moreover variable resistors 362 and 372 are preferably implemented using banks of resistors selectively switched using CMOS transmission gates. Since CMOS transmission gates typically use true and complement control signals, output buffer 300 would also include inverters, not shown in FIG. 3, to form the complements of drive control signals D1 and D2 and each bit of switch signal S1. Note that according to one aspect of output buffer 300, the resistors in variable resistors 362 and 372 are sized to allow the same code for S1 to result in the same slew rate, taking into account differences in size corresponding to the different voltages applied to the first terminals of resistors 362 and 372, respectively.

Transistor 380 has a source connected to $V_{IOHD}$, a gate for receiving signal ENP, and a drain connected to the gate of transistor 310.

In operation, pullup driver 220 is responsive to drive control signals D1 and D2 to provide a high voltage on bonding pad 250 using either a push-pull mode in response to an activation of drive control signal D1, or in a current limited mode in response to an activation of drive control signal D2. When neither drive control signal D1 nor D2 is active, decoder 210 deactivates signal ENP at a logic low, making transistor 380 conductive and disabling transistor 310 by pulling the gate substantially to $V_{IOHD}$.

When drive control signal D1 is active, switch 374 closes and the slew rate on bonding pad 250 becomes a function of R1. During a low-to-high transition on bonding pad 250, the gate of transistor 310 first discharges to a $V_{TP}$ below $V_{IOHD}$ to make transistor 310 conductive. The discharge can happen gradually after data signal D1 closes switch 374, but due to the large gate capacitance on transistor 310, a precharging circuit (not shown in FIG. 3) can be used to perform the voltage reduction quickly. Once transistor 310 is conductive, output buffer 300 enters a high-gain or slewing period in which the gate-to-source voltage of transistor 310 ($V_{GS310}$) remains at $V_{TP}$ substantially independent of its drain-to-source voltage. During the slewing period, the slew rate at bonding pad 250 is set to $I_{SR}/C$, in which $I_{SR}$ is the current through resistor 372 and is equal to (($V_{IOHD}-V_{TP})-V_{SSP})/$R1. When bonding pad 250 has transitioned substantially all the way up to $V_{IOHD}$, output buffer 300 enters a low-gain period during which $V_{GS310}$ fully discharges to $V_{SSP}$. $V_{IOHD}$ is a positive power supply voltage terminal having a nominal voltage of, for example, 3.0 volts, which may be higher than an internal $V_{DD}$ used for internal digital logic. $V_{SSP}$ may be equal to the negative power supply voltage $V_{SS}$ having a nominal value of 0.0 volts, or alternatively it can be dynamically set to a voltage above $V_{SS}$ for some ranges of $V_{IOHD}$ in order to avoid biasing transistor 310 with a $V_{GS}$ that is so high that it might cause gate oxide rupture or other reliability problems. Setting $V_{SSP}$ in this manner will be described more fully with respect to FIG. 8 below.

When drive control signal D2 is active, switch 364 closes and the slew rate on bonding pad 250 becomes a function of R2. During the low-to-high transition on bonding pad 250, the gate of transistor 310 first discharges to a threshold voltage ($V_{TP}$) below $V_{IOHD}$ to make transistor 310 conductive (either gradually or with the assistance of a precharge circuit as described above). Once transistor 310 is conductive, output buffer 300 enters the slewing period in which its gate-to-source voltage ($V_{GS310}$) remains at $V_{TP}$ substantially independent of its drain-to-source voltage. During the slewing period, the slew rate at bonding pad 250 is set to $I_{SR}/C$, in which $I_{SR}$ is the current through resistor 362 and is equal to ($V_{GS352}-V_{TP}$)/R2, and in which $V_{GS352}$ is the gate-to-source voltage of transistor 352. When bonding pad 250 has transitioned substantially all the way up to $V_{IOHD}$, output buffer 300 enters a low-gain period during which $V_{GS310}$ discharges substantially to $V_{GS352}$.

Note that the first terminals of resistors 372 and 362 are biased with different voltages: $V_{SSP}$ for resistor 372, and the $V_{GS}$ of transistor 352 for resistor 362. Thus if R1 and R2 assumed the same value, then the slew rates would be different because the current through the resistors would be different. However by separating the resistors, the values of R1 and R2 can be scaled with respect to each other to take into account the different bias conditions so that control signal S1 selects the same slew rate regardless of the selected MODE. This feature allows easier programming by the user, and the slew rate can be conveniently selected by programming particular bits, for example, in a configuration register.

Figure 4:
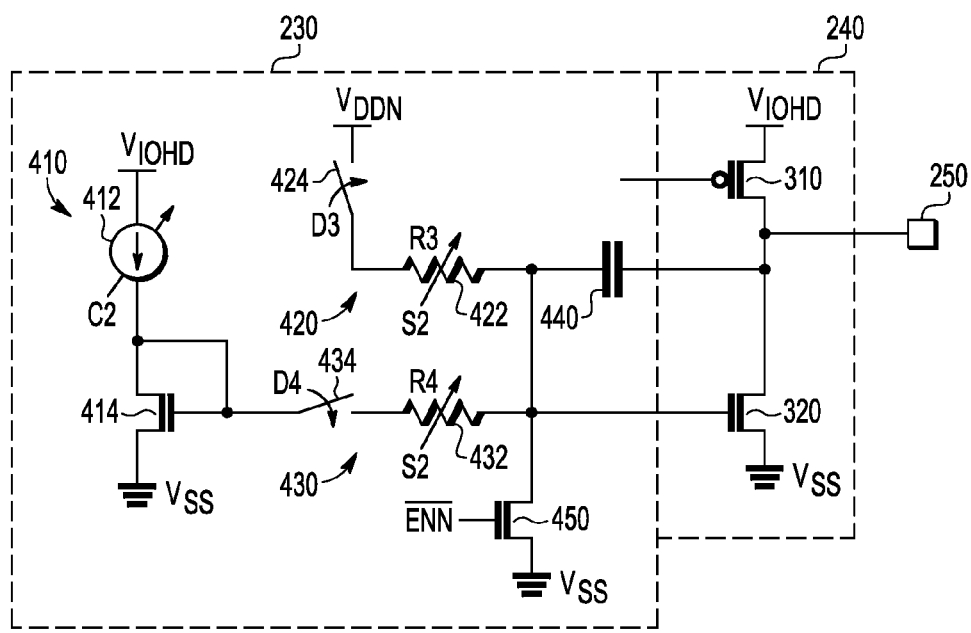
FIG. 4 illustrates in schematic form a portion of an output buffer for use with the output buffer of FIG. 2.

FIG. 4 illustrates in schematic form a portion of an output buffer 400 for use with output buffer 300 of FIG. 3. Output buffer 400 includes an implementation of pulldown driver 230 and output stage 240, which are identified by dashed boxes so labeled, in addition to bonding pad 250. Output stage 240 is constructed as noted with respect to FIG. 3 above.

Pulldown driver 230 includes a current mirror input branch 410, a switchable resistor 420, a switchable resistor 430, a capacitor 440, and an N-channel transistor 450. Current mirror input branch 410 includes a current source 412 and an N-channel transistor 414. Current source 412 has a first terminal connected to $V_{IOHD}$, a second terminal, and a control terminal for receiving control signal C2. Transistor 414 has a drain connected to the second terminal of current source 412, a gate connected to the drain thereof, and a source connected to $V_{SS}$.

Switchable resistor 420 includes a variable resistor 422 and a switch 424. Variable resistor 422 has a first terminal connected to the gate of transistor 320 and a first terminal of capacitor 440, a second terminal, and a control terminal for receiving control signal S2, and has an associated resistance labeled "R3". Switch 424 has a first terminal connected to the second terminal of resistor 422, a second terminal connected to $V_{DDN}$, and is closed in response to an activation of signal D3.

Switchable resistor 430 includes a variable resistor 432 and a switch 434. Variable resistor 432 has a first terminal connected to the gate of transistor 320 and the first terminal of capacitor 440, a second terminal, and a control terminal for receiving control signal S2, and has an associated resistance labeled "R4". Switch 434 has a first terminal connected to the second terminal of resistor 432, a second terminal connected to the drain and gate of transistor 414, and is closed in response to an activation of signal D4.

Capacitor 440 has a second terminal connected to the drain of transistor 320. Transistor 450 has a drain connected to the gate of transistor 320, a gate for receiving a signal labeled "$\overline{ENN}$", and a source connected to $V_{SS}$.

In operation, pulldown driver 230 is responsive to drive control signals D3 and D4 to provide a low voltage on bonding pad 250 using either a push-pull mode in response to an activation of drive control signal D3, or in a current limited mode in response to an activation of drive control signal D4. When neither drive control signal D1 nor D2 is active, decoder 210 deactivates signal $\overline{ENN}$ at a logic high, making transistor 450 conductive and disabling transistor 320 by pulling the gate substantially to $V_{SS}$.

When drive control signal D3 is active, switch 424 closes and the slew rate on bonding pad 250 becomes a function of R3. During a high-to-low transition on bonding pad 250, the gate of transistor 320 first charges to a threshold voltage ($V_{TN}$) above $V_{SS}$ to make transistor 320 conductive. The charging can happen gradually after data signal D3 closes switch 424, but due to the large gate capacitance on transistor 320, a precharging circuit (not shown in FIG. 4) can be used to perform the voltage increase quickly. Once transistor 320 is conductive, output buffer 400 enters a high-gain or slewing period in which the gate-to-source voltage of transistor 320 ($V_{GS320}$) remains at $V_{TN}$ substantially independent of its drain-to-source voltage. During the slewing period, the slew rate at bonding pad 250 is set to $I_{SR}/C$, in which $I_{SR}$ is the current through resistor 422 and is equal to $(V_{DDN}-V_{TN})/R3$. When bonding pad 250 has transitioned substantially all the way down to $V_{SS}$, output buffer 400 enters a low-gain period during which $V_{GS320}$ charges substantially to $V_{DDN}$. $V_{DDN}$ may either be equal to positive power supply voltage $V_{IOHD}$, or it can be dynamically set to at a voltage below $V_{IOHD}$ for some ranges of $V_{IOHD}$ in order to avoid biasing transistor 320 with a $V_{GS}$ that is so high that it might cause gate oxide rupture or reliability problems. Setting $V_{DDN}$ in this manner will be described more fully with respect to FIG. 9 below.

When drive control signal D4 is active, switch 434 closes and the slew rate on bonding pad 250 becomes a function of R4. During the high-to-low transition on bonding pad 250, the gate of transistor 320 first charges to a $V_{TN}$ above $V_{SS}$ to make transistor 320 conductive (either gradually or with the assistance of a precharge circuit as described above). Once transistor 320 is conductive, output buffer 300 enters the slewing period in which $V_{GS320}$ remains at $V_{TN}$ substantially independent of its drain-to-source voltage. During the slewing period, the slew rate at bonding pad 250 is set to $I_{SR}/C$, in which $I_{SR}$ is the current through resistor 432 and is equal to $(V_{GS414}-V_{TN})/R4$, and in which $V_{GS414}$ is the gate-to-source voltage of transistor 414. When bonding pad 250 has transitioned substantially all the way down to $V_{SS}$, output buffer 300 enters a low-gain period during which $V_{GS320}$ charges substantially to $V_{GS414}$.

As with pullup driver 220, the values of R3 and R4 are scaled with respect to each other to provide the same slew rate regardless of the mode. Moreover in the general case shown in FIGS. 3 and 4, S1 can be set independently of S2, but in one particular embodiment S1=S2 to simplify slew rate selection.

Thus, output buffer 200 as implemented with pullup driver 220 shown in FIG. 3 and pulldown driver 230 shown in FIG. 4 provides a flexible output buffer that supports both push-pull and current limited modes. Moreover, output buffer 200 performs programmable slew rate control using variable resistors instead of current sources or buffers and thus provides low power consumption to enable a low power mode.

Figures 5, 6, 7:
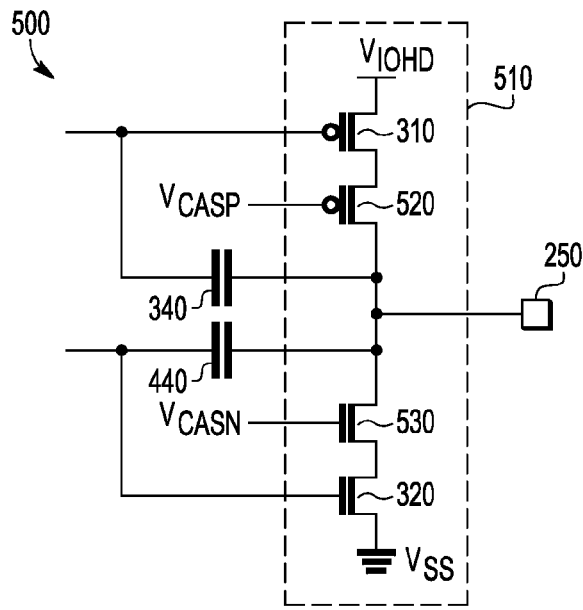
FIG. 5 illustrates in schematic form a portion of an output buffer according to another embodiment of the output buffer of FIG. 2.
FIG. 6 illustrates a graph to illustrate the generation of first one of the voltages used in the embodiment of FIG. 4.
FIG. 7 illustrates a graph to illustrate the generation of second one of the voltages used in the embodiment of FIG. 5.

FIG. 5 illustrates in schematic form a portion of an output buffer 500 according to another embodiment of output buffer 200 of FIG. 2. In output buffer 500, an output stage 510 is suitable for use with low voltage CMOS processes. Output stage 510 includes pullup transistor 310 and pulldown transistor 320 as in output stage 240, but additionally includes a P-channel transistor 520 and an N-channel transistor 530 both connected in the cascode configuration. Transistor 520 is coupled between the drain of transistor 310 and bonding pad 250, and has a source connected to the drain of transistor 310, a gate for receiving a bias signal labeled "$V_{CASP}$", and a drain connected to bonding pad 250. Likewise transistor 530 is coupled between the drain of transistor 320 and bonding pad 250, and has a drain connected to bonding pad 250, a gate for receiving a bias signal labeled "$V_{CASN}$", and a source connected to the drain of transistor 320.

Note that to accommodate transistor 520, capacitor 340 is connected between the gate of transistor 310 and the drain of transistor 520. Likewise, capacitor 440 is connected between the gate of transistor 320 and the drain of transistor 530.

By adding transistors 520 and 530 in the cascode configuration, output buffer 500 prevents the entire $V_{IOHD}$-to-$V_{SS}$ rail from appearing across the gate and source of either of transistors 310 and 320. Limiting the voltage across the terminals is helpful in low voltage CMOS processes in which transistors encounter reliability problems when subjected to large gate-to-source or drain-to-source bias voltages.

To further limit the maximum gate-to-source voltage, bias voltages $V_{CASP}$ and $V_{CASN}$ can be dynamically set based on the value of $V_{IOHD}$ so that output stage 510 functions well as power supply voltages vary, such as in battery applications. The dynamic setting of $V_{CASN}$ and $V_{CASP}$ will be described more fully below with respect to FIGS. 7 and 9.

FIG. 6 illustrates a graph 600 to illustrate the generation of first one of the voltages used in output buffer 400 of FIG. 4. In graph 600, the horizontal axis represents $V_{IOHD}$ in volts, and the vertical axis represents $V_{DDN}$ in volts. A waveform 610 represents the actual $V_{DDN}$ waveform, and a dashed line 620 represents the points at which $V_{DDN}=V_{IOHD}$. When $V_{IOHD}$ is below a certain value, 3.3 volts in the illustrated embodiment, the value of $V_{DDN}$ equals $V_{IOHD}$ along line 620. However when $V_{IOHD}$ exceeds 3.3 volts, the value of $V_{DDN}$ remains constant at 3.3 volts.

FIG. 7 illustrates a graph 700 to illustrate the generation of a second one of the voltages used in output buffer 400 of FIG. 4. In graph 700, the horizontal axis represents $V_{IOHD}$ in volts, and the vertical axis represents $V_{CASN}$ in volts. A waveform 710 represents the actual $V_{CASN}$ waveform, and a dashed line 720 represents the points at which $V_{DDN}=V_{IOHD}$. When $V_{IOHD}$ is below a certain value, in the illustrated embodiment 3.6 volts, the value of $V_{CASN}$ is set to be equal to $V_{IOHD}$ along line 720. However when $V_{IOHD}$ exceeds 3.6 volts, the value of $V_{CASN}$ remains constant at 3.6 volts.

Figure 8:
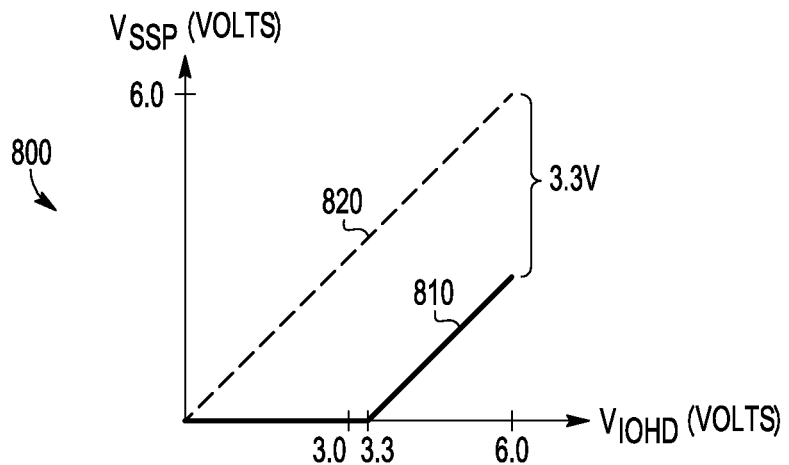
FIG. 8 illustrates a graph to illustrate the generation of first one of the voltages used in the embodiment of FIG. 3.

FIG. 8 illustrates a graph 800 to illustrate the generation of first one of the voltages used in output buffer 300 of FIG. 3. In graph 800, the horizontal axis represents $V_{IOHD}$ in volts, and the vertical axis represents $V_{SSP}$ in volts. A waveform 810 represents the actual $V_{SSP}$ waveform, and a dashed line 820 represents the points at which $V_{SSP}=V_{IOHD}$. When $V_{IOHD}$ is below a certain value, in the illustrated embodiment 3.3 volts, the value of $V_{SSP}$ is set to be equal to $V_{SS}$ at 0.0 volts. However when $V_{IOHD}$ exceeds 3.3 volts, the value of $V_{SSP}$ rises in proportion to $V_{IOHD}$ and is equal to $V_{IOHD}$–3.3 volts.

Figure 9:
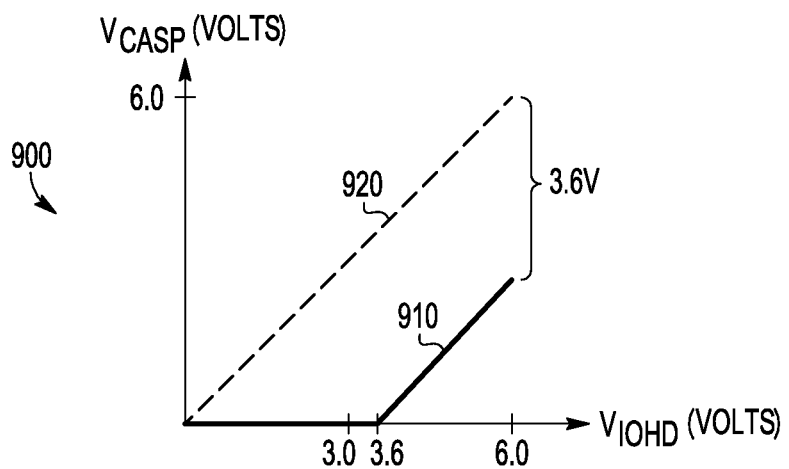
FIG. 9 illustrates a graph to illustrate the generation of second one of the voltages used in the embodiment of FIG. 5.

FIG. 9 illustrates a graph 900 to illustrate the generation of second one of the voltages used in output buffer 300 of FIG. 3. In graph 900, the horizontal axis represents $V_{IOHD}$ in volts, and the vertical axis represents $V_{CASP}$ in volts. A waveform 910 represents the actual $V_{CASP}$ waveform, and a dashed line 920 represents the points at which $V_{CASP}=V_{IOHD}$. When $V_{IOHD}$ is below a certain value, in the illustrated embodiment 3.6 volts, the value of $V_{CASP}$ is set to be equal to $V_{SS}$ at 0.0 volts. However when $V_{IOHD}$ exceeds 3.6 volts, the value of $V_{CASP}$ rises in proportion to $V_{IOHD}$ and is equal to $V_{IOHD}$–3.6 volts.

To generate the bias voltages of any of FIGS. 6-9, a circuit designer may construct bias voltage generators using any of a variety of well known circuit design techniques.

Output buffer 200 adds flexibility to any of a variety of integrated circuit types. In particular, output buffer 200 allows a microcontroller GPIO port to drive a wider variety of loads, including for example push-pull CMOS levels and audio loudspeakers. Various implementations of the components of output buffer 200 allow further flexibility. For example, transistor stresses can be reduced by either cascode transistors in output stage 240 as illustrated in FIG. 5, or by dynamic bias voltage generation for reduced gate drive can be used in push-pull mode as illustrated in FIGS. 6-9.

Figure 10:
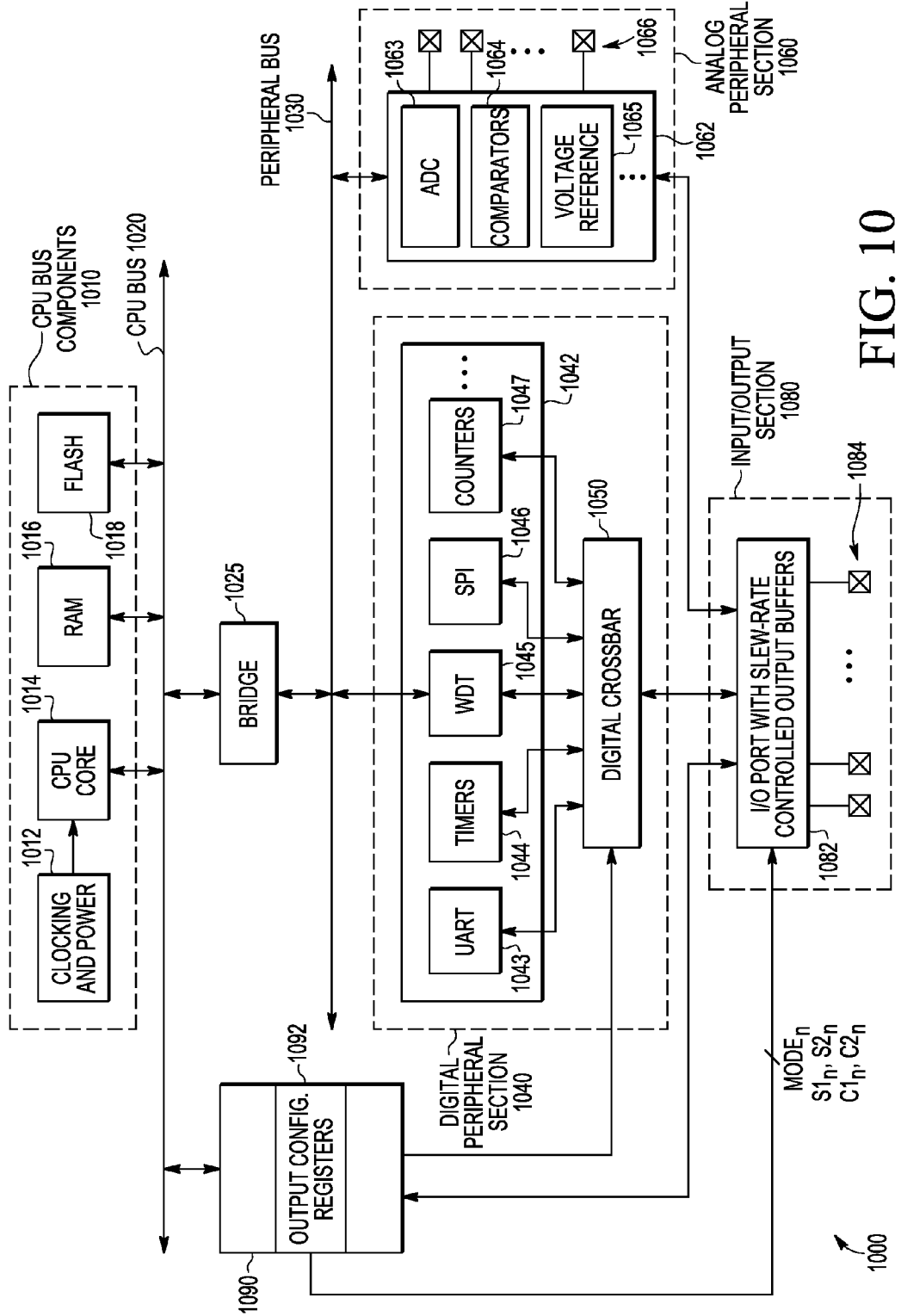
FIG. 10 illustrates in block diagram form an exemplary embodiment of a microcontroller unit (MCU) for use with an output buffer according to exemplary embodiments.

FIG. 10 illustrates in block diagram form an exemplary embodiment of a microcontroller unit (MCU) 1000 for use with an output buffer according to exemplary embodiments. MCU 1000 includes generally a set of central processing unit (CPU) bus components 1010 connected to a CPU bus 1020, a bridge 1025, a peripheral bus 1030, a digital peripheral section 1040, an analog peripheral section 1060, an input/output (I/O) port section 1080, and a set of I/O port configuration registers 1090.

CPU bus components 1010 include a clocking and power module 1012, a CPU core 1014, a random access memory 1016, and a FLASH memory 1018. Clocking and power module 1012 includes both a clock generator with programmable modes including low power modes, and a power supply voltage controller for regulating an input power supply voltage to provide internal voltages, including $V_{DD}$ as described above, as well as voltages $V_{SSP}$, $V_{SSN}$, $V_{CASP}$, and $V_{CASN}$.

CPU core 1014 operates in response to the clock signals and power supply voltages provided by clocking and power module 1012, and is connected to CPU bus 1020 for outputting data thereto and inputting data and instructions therefrom. CPU core 1014 may be any conventional CPU core, for example a based on any known proprietary architecture, on an architecture licensed by a third party or available in a standard cell library, or a special purpose or custom designed architecture. It may also employ any architecture appropriate for the intended application, such as complex instruction set computer (CISC), reduced instruction set computer (RISC), digital signal processor (DSP), very long instruction word (VLIW), and so on.

RAM 1016 is connected to CPU bus 1020 for providing data thereto and storing data therefrom, and includes storage locations for volatile storage of data, parameters, program segments, etc. As is conventional in MCUs, the size of RAM 1016 may vary in different models according to the intended application.

FLASH 1018 is connected to CPU bus 1020 for providing data thereto and storing data therefrom and includes storage locations for nonvolatile storage of data, parameters, and an operating program. Since FLASH 1018 may be reprogrammed, it is well suited for storing the operating program run on CPU core 1014 since it allows for periodic updates and enhancements. Like RAM 1016, the size of FLASH 1018 may vary in different models according to the intended application.

Bridge 1025 is the mechanism for transferring accesses originated on CPU bus 1020 onto peripheral bus 1030 and vice versa. In the exemplary MCU, it includes both address recognition capabilities and a direct memory access (DMA) engine so repetitive or long transfers of data can take place without the intervention of CPU core 1014.

Digital peripheral section 1040 includes a set of digital peripherals 1042 and a digital crossbar 1050. Set 1042 is connected to peripheral bus 1030 and digital crossbar 1050 and includes representative peripherals 1043-1047, such as a universal asynchronous receiver/transmitter (UART) 1043, a set of timers 1044, a watchdog timer 1045, a serial peripheral interface (SPI) 1046, and a set of counters 1047. The peripherals illustrated in set 1042 in FIG. 10 are only exemplary and the actual peripherals implemented will vary between different MCUs based on the intended application. Digital crossbar 1050 is connected to input/output section 1080 and is the mechanism by which selected ones of digital peripherals in set 1042 can be connected to I/O ports in input/output section 1080, and includes a control input for receiving a set of configuration signals for mapping the selected peripherals to specific I/O ports.

Analog peripheral section 1060 includes a set of analog peripherals 1062 and a set of analog-specific terminals 1066. Set 1062 is connected to peripheral bus 1030, analog-specific terminals 1066, and I/O section 1080. Since analog peripheral section 1060 includes components which process analog signals, it may be advantageously placed onto a different voltage plane than the digital components digital peripheral section 1040 and CPU bus components 1010 to accommodate the larger headroom requirements. Set 1062 includes representative peripherals 1063-1065, such as an analog-to-digital converter (ADC) 1063, a set of comparators 1064, and a voltage reference block 1065. Selected ones of set 1062 may also be connected to input/output section 1080 in order to transmit digital signals. For example ADC 1063 may translate an input voltage received on one of terminals 1066 into a digital code that is output to I/O section 1080. As with the digital peripherals in set 1042, the peripherals illustrated in set 1062 are only exemplary and will vary between different MCUs based on the intended application.

I/O section 1080 includes an I/O port with slew rate controlled output buffers 1082, and a set of bonding pads 1084. Port 1082 includes a connection to a pin data register, a connection to digital crossbar 1050, a connection to set of analog peripherals 1062, and connections to each bonding pad in set 1084, all for transferring data in either direction, and a control input. In general, I/O section 1080 includes several I/O ports with different capabilities. To meet the specifications of various applications, some (or in alternate embodiments all) of the ports of I/O section 1080 have slew rate limiting using either the push-pull or the current limited mode of operation as described above, with the remainder of the I/O ports operating with conventional characteristics. I/O port 1082 receives configuration signals labeled "$MODE_n$", "$S1_n$", "$S2_n$", "$C1_n$", and "$C2_n$" on the control input thereof, in which n represents the port number, and the configuration signals correspond to signals MODE, S1, S2, C1, and C2 described above.

Configuration registers 1090 include a set of configuration registers for programming ports in I/O section 1080, including both conventional I/O port configuration registers and a set of output configuration registers 1092 related to the slew-rate controlled output buffer described above. The conventional registers include pin latch registers, data direction registers, output mode registers, crossbar skip registers allowing an analog function to be mapped to one or more I/O port pins, pullup enable registers, match and enable registers, pulse generator enable registers, and pulse generator phase registers. These registers are conventional and will not be described further.

Output configuration registers 1092 include output mode registers for storing the MODE control signal for each affected port, slew rate control registers for storing S1 and S2, and current control registers for storing C1 and C2.

One possible use of I/O port 1082 is for an infrared (IR) light emitting diode (LED) driver. Since the LEDs will be turned on and off relatively infrequently, they may be controlled by software running on CPU core 1014 writing specific data values into the pin latch register, and programming the associated direction register to output. Moreover, IR LEDs are preferably placed into current limited mode (MODE=1) to ensure uniform brightness, with their slew rate controlled to a specific, desired value.

Other possible applications for the current limited mode of I/O port 1082 include motor controllers which drive large off-chip power MOSFETs (or in the case of small motors drive the motor phases of an H-bridge directly), and class D amplifiers. Moreover I/O terminals with current limited mode may be used by peripherals located in digital peripheral section 1040, or by CPU core 1014 driving the values on the I/O port directly through the pin latch registers.

By integrating the capabilities of output buffer 200 into an MCU I/O port, MCU 1000 adds additional flexibility over known MCU designs, allowing MCU 1000 to be used for a wider class of applications while providing very high integration. While output buffer 200 was illustrated in the context of an integrated circuit output buffer using a bonding pad as the output terminal, in alternate embodiments output buffer 200 could be used to drive another type of signal line on which it is desired to provide slew rate control, such as a heavily loaded signal line internal to an integrated circuit.

The above-disclosed subject matter is to be considered illustrative, and not restrictive, and the appended claims are intended to cover all such modifications, enhancements, and other embodiments that fall within the true scope of the claims. Thus, to the maximum extent allowed by law, the scope of the present invention is to be determined by the broadest permissible interpretation of the following claims and their equivalents, and shall not be restricted or limited by the foregoing detailed description.

What is claimed is:

1. An output buffer, comprising:
   a pullup driver having a drive control input, and an output for providing a pullup drive signal to provide a high voltage on an output terminal both in a push-pull mode in response to receiving a first drive control signal on said drive control input and in a current limited mode in response to receiving a second drive control signal on said drive control input, wherein after a slewing period said pullup driver provides said pullup drive signal at a first predetermined voltage in said push-pull mode and at a voltage set by a first current source in said current limited mode;
   a pulldown driver having a drive control input, and an output for providing a pulldown drive signal to provide a low voltage on said output terminal both in said push-pull mode in response to receiving a third drive control signal on said drive control input and in said current limited mode in response to receiving a fourth drive control signal on said drive control input, wherein after said slewing period said pulldown driver provides said pulldown drive signal at a second predetermined voltage in said push-pull mode and at a voltage set by a second current source in said current limited mode; and
   an output stage for providing a voltage on said output terminal in response to said pullup and pulldown drive signals.

2. The output buffer of claim 1, wherein said output stage comprises:
   a first transistor having a first current terminal coupled to a first power supply voltage terminal, a control terminal for receiving said pullup drive signal, and a second current terminal coupled to said output terminal; and
   a second transistor having a first current terminal coupled to said second current terminal of said first transistor, a control terminal for receiving said pulldown drive signal, and a second current terminal coupled to a second power supply voltage terminal.

3. The output buffer of claim 2, wherein:
   said pullup driver further has a slew rate control input for receiving a first slew rate control signal and causes said output stage to change a voltage on said output terminal at a first slew rate determined by said first slew rate control signal in response to either said first drive control signal or said second drive control signal; and
   said pulldown driver further has a slew rate control input for receiving a second slew rate control signal and causes said output stage to change a voltage on said output terminal at a second slew rate determined by said second slew rate control signal in response to either said third drive control signal or said fourth drive control signal.

4. The output buffer of claim 3, wherein said pullup driver comprises:
   a first current mirror input branch having an output terminal;
   a first switchable resistor selectively coupled between said output terminal of said first current mirror input branch and said control terminal of said first transistor, in response to said second drive control signal, and having a resistance that varies response to said first slew rate control signal; and
   a second switchable resistor selectively coupled between said control terminal of said first transistor and a third power supply voltage terminal in response to said first drive control signal, and having a resistance that varies in response to said first slew rate control signal; and
   a first capacitor having a first terminal coupled to said control terminal of said first transistor, and a second terminal coupled to said second current terminal of said first transistor.

5. The output buffer of claim 4, wherein said first switchable resistor comprises:
   a variable resistor having a first terminal coupled to said control terminal of said first transistor, a second terminal, and a control terminal for receiving said first slew rate control signal; and
   a switch having a first terminal coupled to said second terminal of said variable resistor, a second terminal coupled to said output terminal of said current mirror input branch, and a control terminal for receiving said second drive control signal.

6. The output buffer of claim 5, wherein said second switchable resistor comprises:

a variable resistor having a first terminal coupled to said control terminal of said first transistor, a second terminal, and a control terminal for receiving said first slew rate control signal; and and a switch having a first terminal coupled to said second terminal of said variable resistor, a second terminal coupled to said third power supply voltage terminal, and a control terminal for receiving said first drive control signal.

7. The output buffer of claim 3, wherein said pulldown driver comprises:
a second current mirror input branch having an output terminal; and
a third switchable resistor selectively coupled between a fourth power supply voltage terminal and said control terminal of said second transistor and in response to said third drive control signal, and a control terminal for receiving said second slew rate control signal;
a fourth switchable resistor selectively coupled between said output terminal of said second current mirror input branch and said control terminal of said second transistor in response to said fourth drive control signal, and a control terminal for receiving said second slew rate control signal; and
a second capacitor having a first terminal coupled to said first current terminal of said second transistor, and a second terminal coupled to said control terminal of said second transistor.

8. The output buffer of claim 7, wherein said third switchable resistor comprises:
a variable resistor having a first terminal coupled to said control terminal of said second transistor, a second terminal, and a control terminal for receiving said second slew rate control signal; and
a switch having a first terminal coupled to said second terminal of said variable resistor, a second terminal coupled to said fourth power supply voltage terminal, and a control terminal for receiving said third drive control signal.

9. The output buffer of claim 8, wherein said fourth switchable resistor comprises:
a variable resistor having a first terminal, a second terminal coupled to said control terminal of said second transistor, and a control terminal for receiving said second slew rate control signal; and
a switch having a first terminal coupled to said output terminal of said second current mirror input branch, a second terminal coupled to said first terminal of said variable resistor, and a control terminal for receiving said fourth drive control signal.

10. The output buffer of claim 2, wherein said output stage further comprises:
a third transistor having first and second current terminals coupled between said second current terminal of said first transistor and said output terminal, and a control terminal for receiving a first bias voltage; and
a fourth transistor having first and second current terminals coupled between said output terminal and said first current terminal of said second transistor, and a control terminal for receiving a second bias voltage.

11. An output buffer, comprising:
a decoder having a first input for receiving a data signal, a second input for receiving a mode signal, a first output for providing first and second drive control signals, and a second output for providing third and fourth drive control signals, wherein said decoder provides selected ones of said first and third drive control signals in response to respective first and second states of said data signal when said mode signal is in a first state, and provides selected ones of said second and fourth drive control signals in response to said respective first and second states of said data signal when said mode signal is in a second state;
a pullup driver having an input coupled to said first output of said decoder, and an output for providing a pullup drive signal to provide a high voltage on an output terminal both in a push-pull mode in response to said first drive control signal and in a current limited mode in response to said second drive control signal, wherein after a slewing period said pullup driver provides said pullup drive signal at a first predetermined voltage in said push-pull mode and at a voltage set by a first current source in said current limited mode;
a pulldown driver having an input coupled to said second output of said decoder, and an output for providing a pulldown drive signal to provide a low voltage on said output terminal both in said push-pull mode in response to said third drive signal and in said current limited mode in response to said fourth drive signal, wherein after said slewing period said pulldown driver provides said pulldown drive signal at a second predetermined voltage in said push-pull mode and at a voltage set by a second current source in said current limited mode; and
an output stage for providing a voltage on said output terminal in response to said pullup and pulldown drive signals.

12. The output buffer of claim 11, wherein said decoder has a third input for receiving an output enable signal, and keeps said first, second, third, and fourth drive control signals inactive when said output enable signal is inactive.

13. The output buffer of claim 11, wherein said pullup driver further has a second input for receiving a first slew rate control signal, and said pulldown driver further has a second input for receiving a second slew rate control signal.

14. The output buffer of claim 13, wherein said pullup driver changes a voltage on said output terminal at substantially the same slew rate according to said first slew rate control signal regardless of a state of said mode signal, and said pulldown driver changes a voltage on said output terminal at substantially the same slew rate according to said second slew rate control signal regardless of a state of said mode signal.

15. A method of providing an output signal on an output terminal, comprising:
activating a pullup drive signal to cause a pullup transistor to drive the output signal with a first slew rate indicated by a first slew rate control signal in a push-pull mode in response to a first drive control signal;
activating said pullup drive signal to cause said pullup transistor to drive the output signal with substantially said first slew rate in a current limited mode in response to a second drive control signal;
activating a pulldown drive signal to cause a pulldown transistor to drive the output signal with a second slew rate indicated by a second slew rate control signal in said push-pull mode in response to a third drive control signal;
activating said pulldown drive signal to cause said pulldown transistor to drive the output signal with substantially said second slew rate in said current limited mode in response to a fourth drive control signal; and
driving the output signal on the output terminal using said pullup and pulldown transistors selectively in response to said pullup and pulldown drive signals.

16. The method of claim 15, wherein said activating said pullup drive signal in said push-pull mode further comprises:
coupling a first terminal of a capacitor to the output terminal;
switching a variable resistor between a second terminal of said capacitor and a power supply voltage terminal; and
setting a resistance of said variable resistor in response to said first slew rate control signal.

17. The method of claim 15, wherein said activating said pullup drive signal in said current limited mode further comprises:
coupling a first terminal of a capacitor to the output terminal;
switching a variable resistor between an output of a current mirror input branch and a second terminal of said capacitor; and
setting a resistance of said variable resistor in response to said first slew rate control signal.

18. The method of claim 15, wherein said activating said pulldown drive signal in said push-pull mode further comprises:
coupling a first terminal of a capacitor to the output terminal;
switching a variable resistor between a second terminal of said capacitor and a power supply voltage terminal; and
setting a resistance of said variable resistor in response to said second slew rate control signal.

19. The method of claim 15, wherein said activating said pulldown drive signal in said current limited mode further comprises:
coupling a first terminal of a capacitor to the output terminal;
switching a variable resistor between an output of a current mirror input branch and a second terminal of said capacitor; and
setting a resistance of said variable resistor in response to said second slew rate control signal.

20. The method of claim 15, further comprising:
activating said first drive control signal in response to a first state of a data signal and a first state of a mode signal;
activating said second drive control signal in response to said first state of said data signal and a second state of said mode signal;
activating said third drive control signal in response to a second state of said data signal and said first state of said mode signal; and
activating said fourth drive control signal in response to said second state of said data signal and said second state of said mode signal.

* * * * *